United States Patent [19]

Vaerewyck et al.

[11] 4,363,061
[45] Dec. 7, 1982

[54] ELECTRIC MOTOR AND TRANSFORMER LOAD SENSING TECHNIQUE

[75] Inventors: Eugene G. Vaerewyck, Pittsburgh; Arthur E. Anderson, Murrysville, both of Pa.

[73] Assignee: Westinghouse Electric Corp., Pittsburgh, Pa.

[21] Appl. No.: 158,108

[22] Filed: Jun. 10, 1980

[51] Int. Cl.³ .............................................. H02H 7/085
[52] U.S. Cl. ........................................ 361/31; 324/96; 361/94; 250/225; 455/602
[58] Field of Search ................ 361/31, 93, 94, 96, 361/23, 24, 30, 1, 35, 87; 324/96; 307/311; 350/96.28, 96.13, 96.1; 250/199, 225, 231, 220

[56] References Cited

U.S. PATENT DOCUMENTS

| | | | |
|---|---|---|---|
| 3,605,013 | 9/1971 | Yoshikawa et al. | 324/96 |
| 3,621,390 | 11/1971 | Von Willisen | 324/96 |
| 3,662,263 | 5/1972 | Bensel | 324/96 |
| 3,675,125 | 7/1972 | Jaecklin | 324/96 |
| 3,964,020 | 6/1976 | Dickerson | 361/93 X |
| 4,075,493 | 2/1978 | Wickersheim | 250/461 R |
| 4,121,122 | 10/1978 | Pokrandt | 361/93 X |
| 4,156,280 | 5/1979 | Griess | 361/90 X |

*Primary Examiner*—Patrick R. Salce
*Attorney, Agent, or Firm*—M. P. Lynch

[57] ABSTRACT

A Faraday rotator optical sensor in combination with optical fiber transmission means is employed to monitor overload current conditions in a high voltage electrical load and transmit this information to a low voltage signal processing circuit while providing desired isolation between the high voltage load and the low voltage signal processing circuit.

7 Claims, 5 Drawing Figures

4,363,061

ELECTRIC MOTOR AND TRANSFORMER LOAD SENSING TECHNIQUE

BACKGROUND OF THE INVENTION

Conventional techniques for measuring current in high voltage motor or transformer circuits employ current transformers with output signals wired directly from the high voltage motor or transformer environment to the low voltage signal processing and control circuitry. In many of these applications the requirement for withstanding high electrical surges, i.e., 60 kV, and the requirement for electromagnetic interference immunity render the conventional current measuring and signal transmission techniques unacceptable. The development of fiber optic waveguide transmission and the present development of optical sensors affords a unique opportunity to enhance isolation between the high voltage and low voltage environments of a motor control or transformer circuit thus providing a current measuring and transmission capability suitable for meeting the safety and operational specifications for transformer and motor control systems.

SUMMARY OF THE INVENTION

There is disclosed herein with reference to the accompanying drawings optical sensing and signal transmission techniques for measuring the current in high voltage electrical loads, such as motor and transformer systems, and processing the transmitted optical information in remote low voltage circuitry to effect prescribed control operations and optically transmit corresponding control or alarm signals from the low voltage circuitry to the high voltage environment to affect the necessary control or alarm functions.

DESCRIPTION OF THE DRAWINGS

The invention will become more readily apparent from the following exemplary description in connection with the accompanying drawings.

DESCRIPTION OF THE PREFERRED EMBODIMENT

Figure 1:
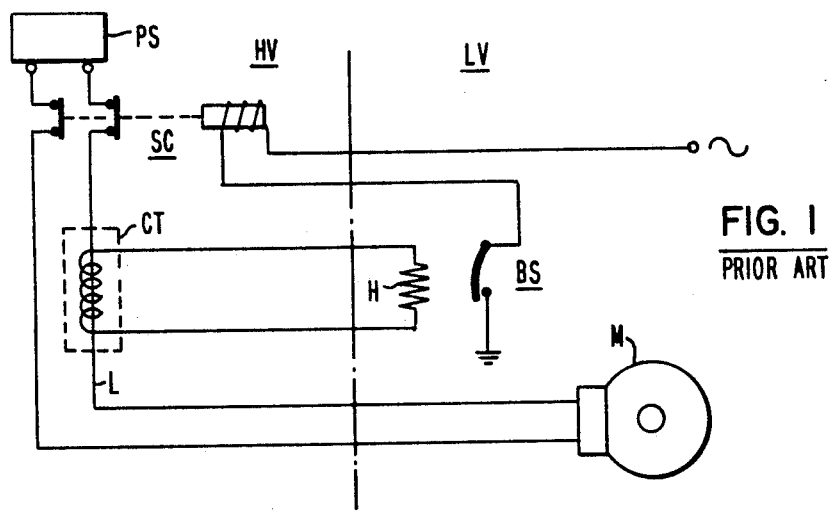
FIG. 1 is a Prior Art illustration of a current sensing technique in a high voltage environment.

Referring to FIG. 1, there is schematically illustrated a Prior Art embodiment of a circuit for monitoring the current through a conductor in a high voltage motor circuit. The current flowing in the electrical bus bar, or lead, L from a high voltage AC source PS through a high voltage switch contactor SC to the motor M is monitored by a current transformer CT. A heater element H is powered by the current developed by the current transformer CT. A bimetallic switch BS responds to a temperature increase resulting from the heater H to deenergize the switch contactor SC in response to a temperature condition which corresponds to an overload current flow in the electrical lead L. The combination of the current transformer CT, the heater H and the bimetallic switch BS provides a means for integrating the load history of the motor M over a prescribed period of time and switching off the motor current if predetermined limits are exceeded. While this current monitoring configuration is widely used, the configuration suffers due to a lack of desired isolation between the high voltage switching section HV and a low voltage signal processing section LV. Furthermore, the typical requirements for surge protection on such systems, which generally requires surge protection of up to 60 kV, is often difficult to maintain with this Prior Art configuration.

The heater element H of the Prior Art must be designed and fabricated to withstand the most severe overload conditions, such as a short circuit, for the period required for the contactor SC to be opened and the current removed from the load M. Burnout of the heater H results in loss of control on the particular bus bar or lead L.

It has been determined experimentally that the inherent properties of optical fibers or waveguides offer the voltage isolation and data transmission capability to meet the safety, i.e. 60 kV surge.

Figure 2:
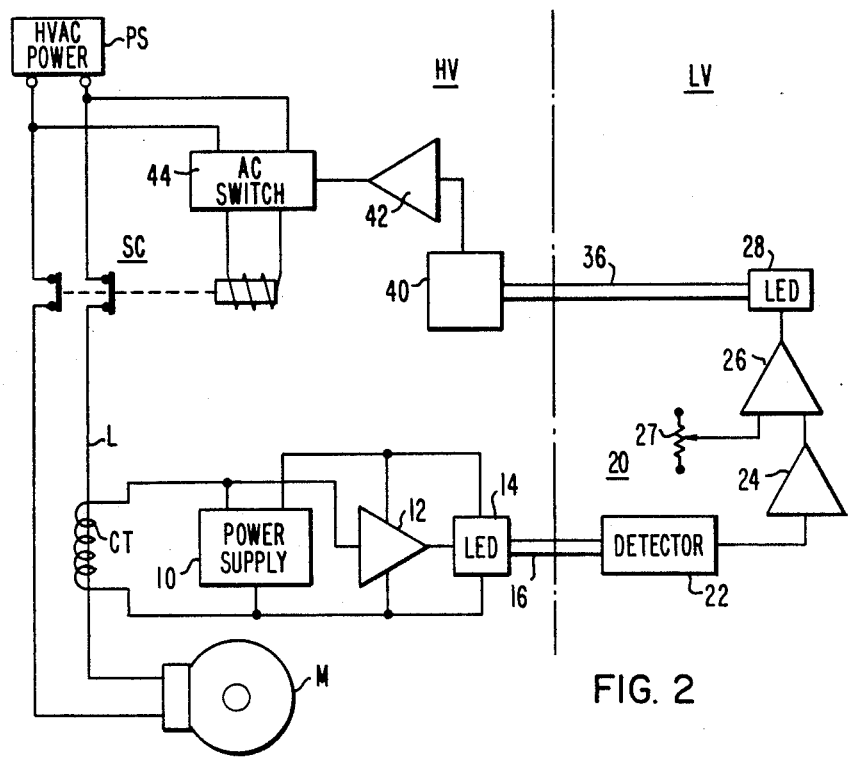
FIG. 2 is a schematic illustration of a modification to the Prior Art embodiment of FIG. 1 employing optical isolating and transmission techniques between a high voltage current measuring environment and a low voltage signal processing environment.

The schematic embodiment of a motor control circuit employing optical transmission between the high voltage HV and low voltage LV sections is schematically illustrated in FIG. 2. The current flow through the electrical lead L from the high voltage AC power source PS via the switch contactor SC to the motor M is monitored by the current transformer CT powered by the power supply 10. The signal developed by the current transformer CT is supplied through the amplifier 12 as an input to the light emitting diode 14. The output of the current transformer CT can serve two functions. First, to provide a signal corresponding to the phase and magnitude of the current flowing in the electrical lead L, and second to provide a source of power to operate the amplifier 12 and drive the light-emitting diode 14. The optical signal developed by the light emitting diode 14 in response to the output signal of the current transformer CT provides real time phase and magnitude information which when transmitted to the signal processing and control circuit 20 by the optical fiber 16 is available to provide thermal history, overload and imbalance signals for the electrical load, herein illustrated to be the motor M. The light emitting diode 14 causes an optical signal equivalent to the current signal developed by the current transformer CT to be transmitted via the optical fiber 16 from the high voltage section HV to the signal processing circuit 20 located in the low voltage section LV. The photodetector circuit 22 of the signal processing circuit 20 processes the current, phase and imbalance data present in the optical signal and develops an output signal which is transmitted via amplifier circuit 24 as one input to the comparator circuit 26. A second input to the comparator circuit 26 is developed by the reference signal circuit 27 which establishes a threshold corresponding to a prescribed maximum limit of current flow in the electrical lead L. The output of the comparator circuit 26 is supplied as an input to the light emitting diode 28. In the event the output signal from the amplifier circuit 24 exceeds the threshold reference signal developed by the reference circuit 27, the output of the comparator circuit 26 produces an optical signal output from the light emitting diode 28 which is transmitted via optical fiber 36 from the low voltage section LV to the detector circuit 40 located in the high voltage section HV. The photodetector circuit 40 responds to the optical signal by generating an output signal which is transmitted via amplifier circuit 42 to an AC switch circuit 44 which functions to deenergize the switch contactor SC thus removing the high voltage ACs excitation from the motor M. The switch contactor SC can be reenergized automatically or manually depending on the application.

Figure 3:
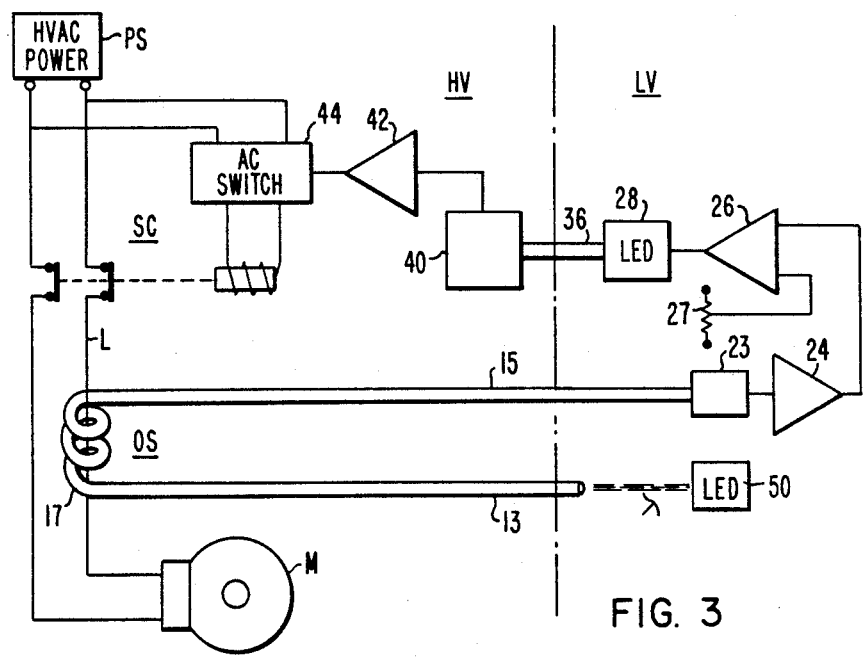
FIG. 3 is a schematic illustration of a further modification of the embodiment of FIG. 2 substituting an optical current sensing element for the current transformer and employing optical transmission of the current measurement between the high voltage and low voltage environments.

In the embodiment schematically illustrated in FIG. 3, the conventional current transformer is replaced as the current sensor by a Faraday rotator optical sensor OS consisting of turns of optical fibers 17 about the electrical lead L. The properties of the optical fibers 17 of the optical sensor OS are such that polarized light introduced to the sensor OS from the light source 50 through the input optical fiber 13 is rotated in response to current flow in the electrical lead L such that the optical signal transmitted from the optical sensor OS through the output optical fiber 15 is an indication of the current flow in the electrical lead L. The inherent Faraday effect present in the optical fiber of the optical sensor OS is utilized to sense the magnetic field generated about the current carrying conductor L. The field produces a modulation in the optical signal transmitted via fiber 15 which is a manifestation of the instantaneous current flow in the current-carrying conductor L. Suitable optical material exhibiting the Faraday effect for implementing the fibers 17 of the optical sensor OS include $SiO_2$, quartz and in particular $Cu_2O$.

The Faraday effect, offers the capability for remote, optical measurement of current through the effect of the magnetic field around the electrical conductor L on an optical material of sensor OS properly configured near the electrical conductor L. Real time performance is very important, especially the lack of turn-on delay. Delay has been a major problem for sensing devices which are powered by a current transformer. The Faraday rotator type optical sensor OS is powered from the low voltage section LV and is energized continuously, or well before high voltage turn-on, thus control is maintained at all times. Unlike the heater element H, the Faraday rotator optical sensor has no failure mode due to excessive current in the bus bar or electrical lead L.

In the embodiment of FIG. 3, an ultimate cost reduction is achieved by replacing the conventional current transformer with the optical sensor OS wherein optical fibers 17 are wound about the electrical lead L to provide a completely dielectric current transformer. While FIG. 3 illustrates the optical fibers to be wound about the electrical conductor, optical fiber materials may also be configured, as shown in FIG. 4, in a Faraday rotator optical sensor arrangement near a bus bar or cable without encircling the bus bar or cable and still producing the desired measuring function.

Figure 4:
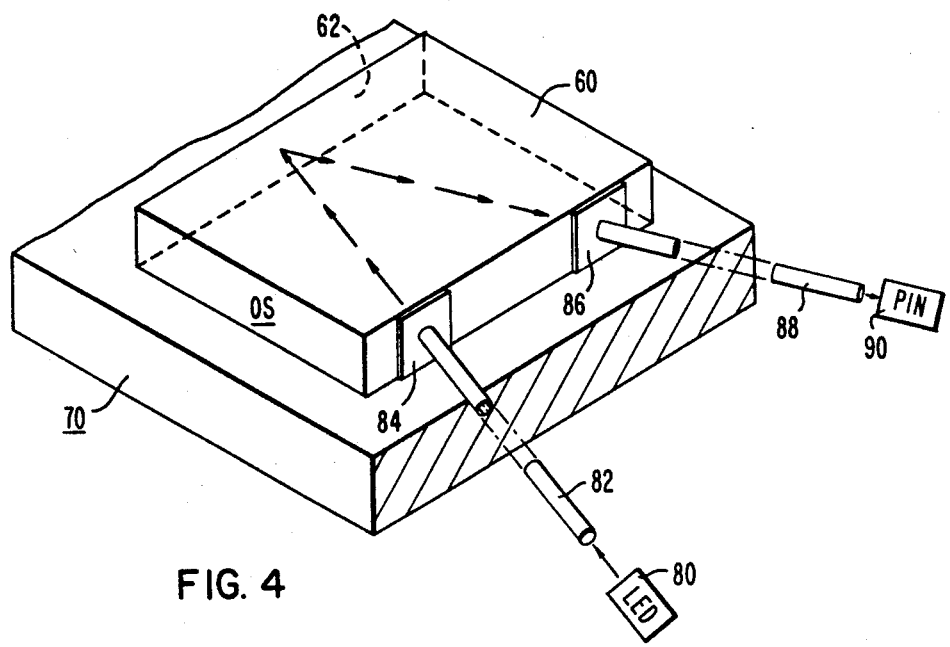
FIG. 4 is an illustration of an alternative Faraday rotator optical sensor embodiment for use in the implementation of FIG. 3.

The optical sensor OS of FIG. 4 consists of a Faraday rotator optical element 60 secured to a current-carrying bus bar 70. Light energy from a suitable source such as the light-emitting diode 80 is introduced into the Faraday rotator optical element 60 via an optical fiber transmitter 82. A light energy polarizer 84 at the interface of the optical fiber transmitter 82 and the Faraday rotator element 60 functions to polarize the light to a predetermined angle of rotation, i.e., 0°, for entry into the Faraday rotator element 60. The light energy introduced into the element 60 is reflected from a mirrored rear wall surface 62 to exit the element 60 via an analyzer element 86 located at the interface of the Faraday rotator element 60 and an optical fiber transmitter 88. The analyzer 86 is in fact a light polarizer comparable to the polarizer 84 which is set at an angle different from the angle of the polarizer 84, which in this case, could typically be at an angle of 45°. The level of light energy transmitted by the analyzer element 86 corresponds to the degree of rotation of the light energy within the element 60 and is indicative of the current flow through the bus bar 70. The light sensitive diode 90 converts the light energy emerging from the analyzer element 86 into an equivalent electrical signal. The polarizer element 84 and analyzer element 86 may be suitably implemented through the use of appropriate Polaroid material. Further, the coupling between the optical fiber transmitter 82 and the Faraday rotator element 60 can be enhanced if the angle of interface corresponds to Brewster's angle. Reflective surface 62 may typically be a silvered mirror surface. In this embodiment, the Faraday rotator element 60 functions to rotate the plane of polarization of the incoming light energy from the light source 80 in response to the level of current flow in the bus bar 70.

The discussion of the use of the Faraday rotation as an optical fiber encircling a conductor to measure currents on high voltage lines is described in the article entitled "Magneto-Optic Current Sensing with Birefringent Fibers" of S. S. Rashleigh appearing in Applied Physics Letters dated June 1, 1979. Other publications discussing the advantages of optical fibers in high voltage applications include:

1. "Light Pulse System Shrinks High Voltage Protection Device" by Clifford Moulten, appearing in Electronics, May, 1965.
2. "Polarization and Magneto-Optic Properties of Single Mode Optical Fiber" by A. M. Smith, appearing in Applied Optics, January, 1978.
3. "Optical Methods for Measurement of Voltage and Current on Power Systems", by A. J. Rogers, appearing in Optics and Laser Technology, December, 1977.
4. "Low-Birefrigence Single Mode Optical Fibers: Preparation and Polarization Characteristics" by Schneider et al., appearing in Applied Optics, October, 1978.
5. "Faraday Effect in Glass Fibers" by Papp et al. appearing in the Journalism of Magnetism and Magnetic Materials, Volume 2, 1976.

The above publications and their content are incorporated herein by reference.

When the linearly polarized light introduced by the light source 50 of FIG. 3 passes through the optical fibers 17 of the optical sensor OS under the influence of the magnetic field produced by the current flow in the electrical conductor L, the direction of polarization of the light is rotated. This phenomenon is known as the Faraday magneto-optic effect. All materials exhibit the Faraday Effect. The effect is weakest for diamagnetic materials and stronger, successively, for paramagnetics and ferromagnetics. Only for diamagnetics, however, is the effect independent of temperature. The intensity of the rotated, polarized light emitted by the output optical fiber 15 is measured by the detector 23. Detector 23 in turn translates this optical signal into an electrical signal which is subsequently amplified by amplifier 24 and supplied as a first input to the comparator circuit 26. As described above, this input signal is compared to a threshold reference signal developed by the reference circuit 27 and in the event the output signal of the amplifier 24 exceeds the predetermined reference threshold, an output signal is supplied to the light emitting diode 28. The optical signal from the light emitting diode 28 in turn is transmitted by the optical fiber 36 to the detector 40 in the high voltage section HV. As described above, the signal developed by the detector 40 operates through the amplifier circuit 42 and the AC switch 44 to deenergize the switch contactor SC in the event of an overload condition.

Figure 5:
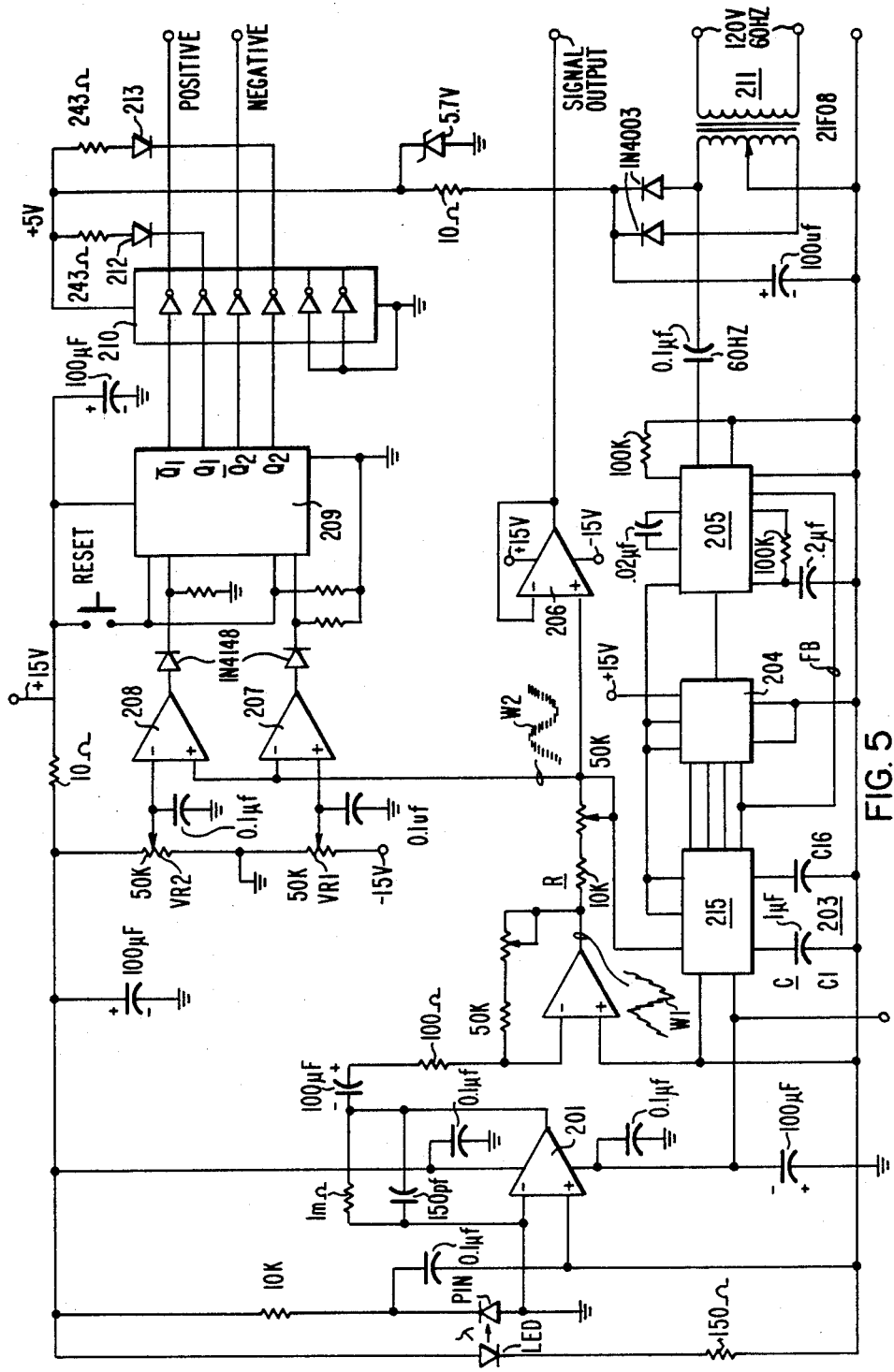
FIG. 5 is a detailed schematic illustration of a signal processing circuit for use with the above embodiments.

While the schematic embodiments of FIGS. 2 and 3 have illustrated a simplified circuit schematic for the signal processing circuit 20, there is illustrated in FIG. 5 a detailed schematic circuit implementation of the signal processing circuit 20.

The modulated optical signals transmitted by the Faraday rotator optical sensor OS in response to optical radiation input from a light emitting diode LED (General Electric Type 55C) is transmitted to a photodiode PIN (RCA Type C30808) which generates a current signal indicative thereof. The operational amplifier 201 functions as a current to voltage converter and converts the current output signal of the photodiode PIN to a voltage signal which is in turn amplified by the high gain voltage amplifier 202. The operational amplifier 206 is employed as a voltage follower having as its input the output of the high gain voltage amplifier 202. Amplifier 206 provides an output signal representing the real time current as sampled by the Faraday rotator optical sensor OS. The operational amplifiers 207 and 208 operate as comparator circuits for the negative and positive half cycles respectively of the current signal corresponding to the optical radiation output of the optical sensor OS. The variable resistor VR1 associated with the amplifier 207 is employed to set a negative threshold, while the variable resistor VR2 associated with amplifier 208 is employed to set a positive threshold. Amplifier 207 provides a positive output level if the current signal exceeds the negative threshold level while amplifier 208 provides a positive output level if the current exceeds the positive threshold level.

A dual, resettable flip-flop circuit 209, (RCA type CD4013) responds to the outputs of the comparator circuits 207 and 208 to store overload signals corresponding to current amplitude exceeding the preset positive and negative thresholds. The outputs of the flip-flop circuit 209 are supplied as inputs to a hex buffer circuit 210 (RCA type CD4049) which in turn develops positive or negative overload output signals in accordance with the output condition of the flip-flop circuit 209. These output signals form the basis of the optical signals transmitted from the low voltage section LV to the high voltage section HV of FIGS. 2 and 3 to control the contactor SC in the event of overload conditions. Hex buffer circuit 210 also drives positive and negative overload indicators 212 and 213 which may be implemented through the use of light emitting diodes. The positive indicator 212 provides overload indications for the positive half cycle of the current signal while the negative overload indicator 213 provides overload indication for the negative half cycle of the current signal.

A sixteen bit analog multiplexer circuit 215, which is typically indicated to be a type MV1606 and is commercially available from Datel-Intersil, Incorporated, functions as an integrating digital filter 203 for 60 Hz. The multiplexer circuit 215 follows the actual current waveshape of the signals developed by the photodiode PIN.

A phase-locked loop circuit 205, which is commercially available from RCA as device type CD 4046, provides a 960 Hz frequency locked to the 60 Hz AC line voltage to drive the multiplexer circuit 203 via a four-stage binary counter circuit 204 which counts down from 960 Hz to 60 Hz and provides the timing to the multiplexer circuit 203. The four-stage binary counter circuit 204 is commercially available from RCA as device type CD4029. A feedback frequency signal FB prevents drift of the filter 203. Temperature effects of a conventional analog active filter are avoided by using a digital filter 203 driven from a 60 Hz line by the phase-locked loop circuit 205 and counter circuit 204.

The filter 203 functions to digitize the AC voltage waveform output W1 of amplifier 202 into a multilevel waveform W2 which is supplied to the amplifiers 207 and 208. The filtering levels are determined by the number of capacitors C1–C16 employed in connection with the multiplexer circuit 215. The filter 203 eliminates noise and spikes present in the AC output waveform W1 of amplifier 202 and supplies a clean 60 Hz signal to the amplifiers 207 and 208. This reduces the likelihood of a false overload indication resulting from noise or transients on the AC output waveform W1.

A further provision to account for thermal history and anticipated, periodic surges, such as the operation of a punch press, is provided by the RC time constant, or built-in delay, afforded by the resistance R in combination with the capacitance C. This time constant, or delay, is designed to meet the particular operating conditions of interest.

One design factor is the thermal lag of the electrical load M. A small motor can only withstand a short period of overload before damage occurs. Thus, the RC time constant can be preset to meet the needs of a given electrical load M.

The transformer 211 provides the 60 Hz reference signal for the phase-locked loop circuit 205.

It has been determined experimentally that improved operation of the sensor configuration OS of FIG. 4 is realized if the polarizer 84 and analyzer 86 are positioned at the interface of the Faraday rotator element 60 and the optical fiber transmitters 82 and 88, respectively. The desired polarization of the incoming light was diminished when the optical fiber transmitter 82 was not straight, or was of significant length, and the polarizer 84 was located at the interface of the light source 80 and the optical fiber transmitter 82.

The adverse effects on polarization caused by the turns in the optical fibers 17 renders the optical sensor configuration of FIG. 4 a more preferred embodiment than that at FIG. 3.

We claim:
1. Apparatus for monitoring the current flow in a high voltage electrical load, such as a motor or transformer, comprising,
 a high voltage section including a Faraday rotator optical sensor means for generating an optical signal indicative of the current flow in a high voltage electrical load, a low voltage section including a signal processing circuit means, first optical coupling means connected between said high voltage section and said low voltage section to optically transmit said optical signal from said Faraday rotator optical sensor means to said signal processing circuit means, said optical coupling means providing electrical isolation and noise immunity for said low voltage section, said signal processing circuit means including first circuit means for converting said optical signal to an electrical signal manifesting the positive and negative half cycles of the current flow in said high voltage electrical load, second circuit means for comparing the positive half cycles of said electrical signal to a predetermined threshold, and the negative half cycles of said electrical signal to a second predetermined threshold and generating electrical overload output signals in the event the half cycles of said electrical signal exceed said respective thresholds, said third circuit means for converting said electrical overload output signal into an optical overload output signal.

2. Apparatus as claimed in claim 1 further including second optical coupling means connected between said low voltage section and said high voltage section, electrical switching means located in said high voltage section and coupling said high voltage electrical load to a high voltage excitation source and switch actuating means connected to said electrical switching means and responding to the optical overload output signals transmitted via said second optical coupling means from said low voltage section to said high voltage section to disconnect said high voltage electrical load from the high voltage excitation source in response to current overload conditions as monitored by said Faraday rotator optical sensor means.

3. Apparatus as claimed in claim 1 wherein said Faraday rotator optical sensor means includes an optical element operatively coupled to said high voltage load, an input optical fiber means and output optical fiber means each contacting a first surface of said optical element, a light reflective coating being on an opposed internal surface of said optical element, a light polarizing element intimately coupling said input optical fiber means and said optical element, a light analyzer element intimately coupling said output optical fiber means and said optical element, a light energy means for introducing light energy through said input optical fiber means and said light energy polarizing means into said optical element, said optical element rotating the polarized light in response to changes in the magnetic field caused by changes in the current flow in said high voltage electrical load, said output optical fiber means coupling said Faraday rotator optical sensor to said low voltage section and transmitting light energy reflected by said light reflective coating through said light energy analyzer means to said signal processing circuit means in said low voltage section, the rotation of the polarized light energy by said optical element being a manifestation of the current flow in said high voltage electrical load.

4. Apparatus as claimed in claim 1 wherein said Faraday rotator optical sensor is constructed of a composition selected from the group consisting of $SiO_2$ and $Cu_2O$.

5. Apparatus as claimed in claim 1 wherein said signal processing circuit means further includes a photo-diode means for converting the optical signal transmitted from said Faraday rotator optical sensor means to said low voltage section into a positive and negative half cycle current waveform corresponding to the signal developed by said Faraday rotor optical sensor means, amplifier means for amplifying said current waveform, and an integrating digital filter means operatively connected to the output of said amlifier means to digitize the AC waveform output of said amplifier means into a multi-level waveform, said integrating digital filter means eliminating spurious signals present in the AC waveform, the resulting filtered AC waveform being supplied to said second circuit means for comparing the positive and negative half cycles of the output signal of said Faraday rotator optical sensor means to predetermined thresholds, said filtered AC waveform reducing the likelihood of false overload indications resulting from noise or transients in the signal supplied to said signal processing circuit means.

6. Apparatus as claimed in claim 5 wherein said integrating digital filter means is a multi-bit analog multiplexer circuit means which tracks the actual current wave shape of the signal developed by the photo-diode means, and a phase-locked loop circuit means locked to a 60 Hertz AC line voltage to drive said multiplexer circuit means to provide timing to the multiplexer circuit means.

7. Apparatus as claimed in claim 5 further including a variable time delay circuit associated with said integrating digital filter means to account for the thermal history and anticipated periodic surges in the signal transmitted from said Faraday rotator optical sensor means to said signal processing circuit means as determined by the application of the high voltage electrical load.

* * * * *